(12) United States Patent
Matsunaga et al.

(10) Patent No.: US 9,034,766 B2
(45) Date of Patent: May 19, 2015

(54) PATTERN FORMATION METHOD

(71) Applicant: Kabushiki Kaisha Toshiba, Minato-ku (JP)

(72) Inventors: Kentaro Matsunaga, Mie-ken (JP); Yoshihiro Yanai, Mie-ken (JP); Hirokazu Kato, Aichi-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/178,723

(22) Filed: Feb. 12, 2014

(65) Prior Publication Data

US 2015/0044874 A1 Feb. 12, 2015

(30) Foreign Application Priority Data

Aug. 7, 2013 (JP) ................... 2013-164026

(51) Int. Cl.
*H01L 21/311* (2006.01)
*H01L 21/308* (2006.01)

(52) U.S. Cl.
CPC .................... *H01L 21/308* (2013.01)

(58) Field of Classification Search
None
See application file for complete search history.

(56) References Cited

U.S. PATENT DOCUMENTS

| 8,334,089 B2 | 12/2012 | Yi et al. |
| 2012/0127454 A1 | 5/2012 | Nakamura et al. |
| 2013/0078570 A1 | 3/2013 | Hieno et al. |

FOREIGN PATENT DOCUMENTS

| JP | 2009-147331 A | 7/2009 |
| JP | 2013-72896 A | 4/2013 |

OTHER PUBLICATIONS

Joy Cheng, et al., "Characterization of DSA Features", Symposium on Lithography Extensions, 2011, pp. 1-19.

*Primary Examiner* — Marvin Payen
(74) *Attorney, Agent, or Firm* — Oblon, Spivak, McClelland, Maier & Neustadt, L.L.P.

(57) ABSTRACT

According to one embodiment, a pattern formation method includes: forming a first guide layer having of first openings exposing a surface of an underlayer, and the first openings being arranged in a first direction; forming a second guide layer on the underlayer and on the first guide layer, the second guide layer extending in the first direction, the second guide layer dividing each of the first openings into the first opening portion and the second opening portion, and the second guide layer being sandwiched by a first opening portion and a second opening portion; forming a block copolymer layer in each of the first opening portion and the second opening portion; forming a first layer and a second layer surrounded by the first layer in each of the first opening portion and the second opening portion by phase-separating the block copolymer layer; and removing the second layer.

15 Claims, 12 Drawing Sheets

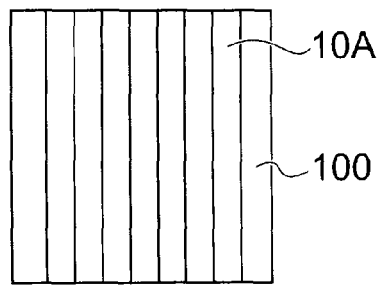
FIG. 8A
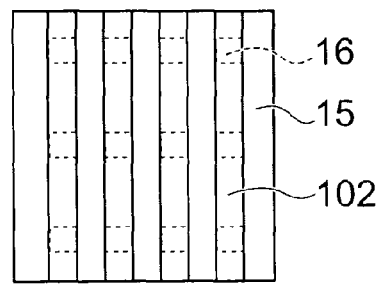
FIG. 8D
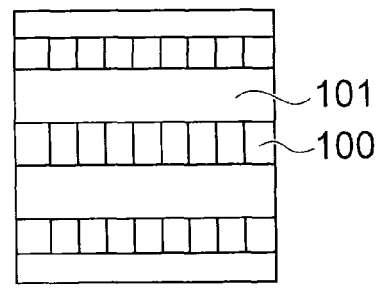
FIG. 8B
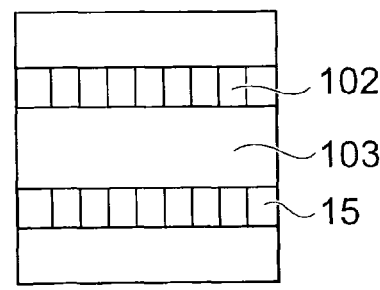
FIG. 8E
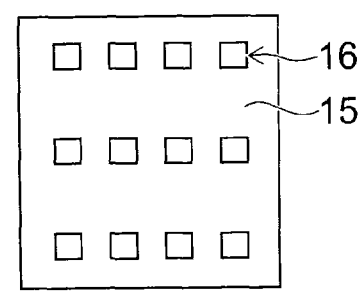
FIG. 8C
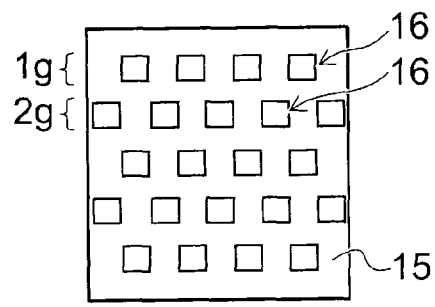
FIG. 8F
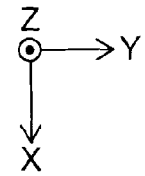

PATTERN FORMATION METHOD

CROSS-REFERENCE TO RELATED APPLICATIONS

This application is based upon and claims the benefit of priority from Japanese Patent Application No. 2013-164026, filed on Aug. 7, 2013; the entire contents of which are incorporated herein by reference.

FIELD

Embodiments described herein relate generally to a pattern formation method.

BACKGROUND

In a photolithography process, there is a case where openings of the resolution limit or less are arranged longitudinally and latitudinally (two-dimensionally) in a mask layer. In such a case, what is called a cross-point method is employed in which a line-and-space pattern used in exposure is formed by two separate steps and photolithography is performed for each step. Here, the line-and-space pattern used in the first exposure and the line-and-space pattern used in the second exposure are made to cross each other.

This method is most suitable to form an opening pattern of what is called a grid configuration in which the phase of the period of the positions of the openings is equal in the longitudinal and latitudinal directions. However, to form an opening pattern of a zigzag configuration in which the phases in the longitudinal and latitudinal directions are shifted, three or more line-and-space pattern formation processes are needed and the processes are complicated. Consequently, manufacturing costs are increased.

BRIEF DESCRIPTION OF THE DRAWINGS

FIG. 8A to FIG. 8F are schematic plan views showing a pattern formation method according to a reference example;

DETAILED DESCRIPTION

Figure 1:
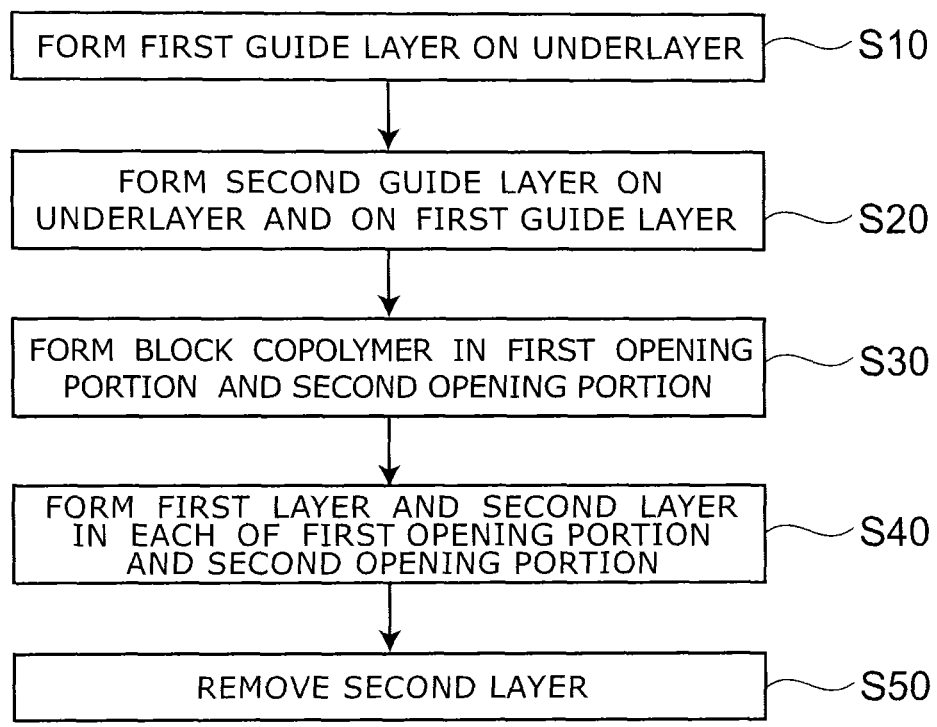
FIG. 1 is a flow chart showing a pattern formation method according to a first embodiment.

In general, according to one embodiment, a pattern formation method includes: forming a first guide layer on an underlayer, the first guide layer having a plurality of first openings exposing a surface of the underlayer, and the plurality of first openings being arranged in a first direction; forming a second guide layer on the underlayer and on the first guide layer, the second guide layer extending in the first direction, the second guide layer dividing each of the plurality of first openings into the first opening portion and the second opening portion, and the second guide layer being sandwiched by a first opening portion and a second opening portion; forming a block copolymer layer in each of the first opening portion and the second opening portion; forming a first layer and a second layer surrounded by the first layer in each of the first opening portion and the second opening portion by phase-separating the block copolymer layer; and removing the second layer.

Hereinbelow, embodiments are described with reference to the drawings. In the following description, identical components are marked with the same reference numerals, and a description of components once described is omitted as appropriate.

First Embodiment

FIG. 1 is a flow chart showing a pattern formation method according to a first embodiment.

FIG. 2A to FIG. 7B are schematic plan views or schematic cross-sectional views showing a pattern formation method according to the first embodiment.

FIG. 2A to FIG. 7B are a specific illustration of the flow shown in FIG. 1. Of FIG. 2A to FIG. 7B, the drawings of the numbers including "A" are schematic plan views, and the drawings of the numbers including "B" are schematic cross-sectional views. The drawings of the numbers including "B" show a cross section taken along line A-B of the drawings of the numbers including "A".

Figure 2A:
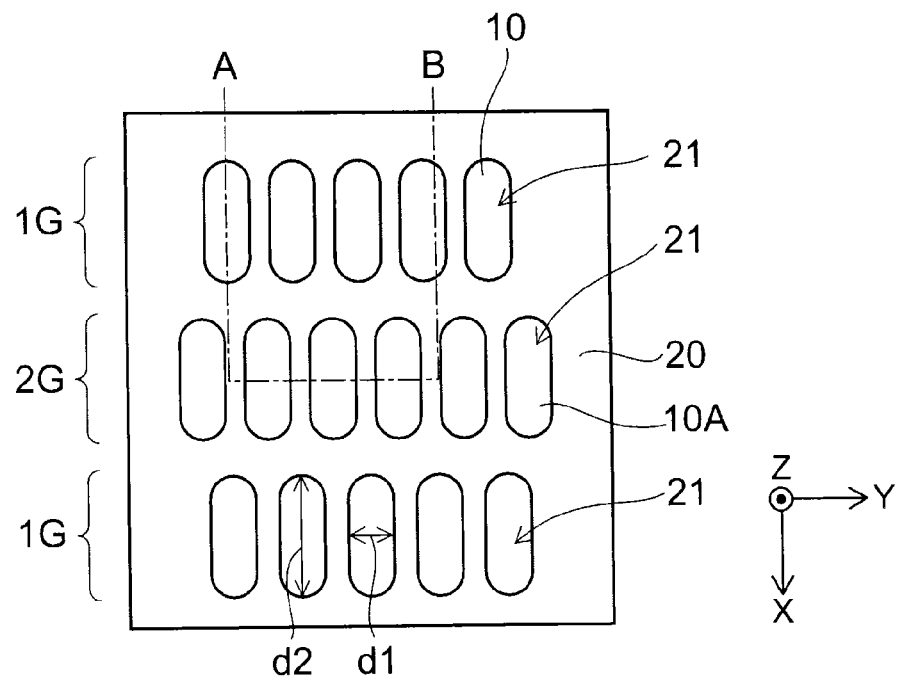
FIG. 2A to FIG. 7B are schematic plan views or schematic cross-sectional views showing a pattern formation method according to the first embodiment.
Figure 2B:
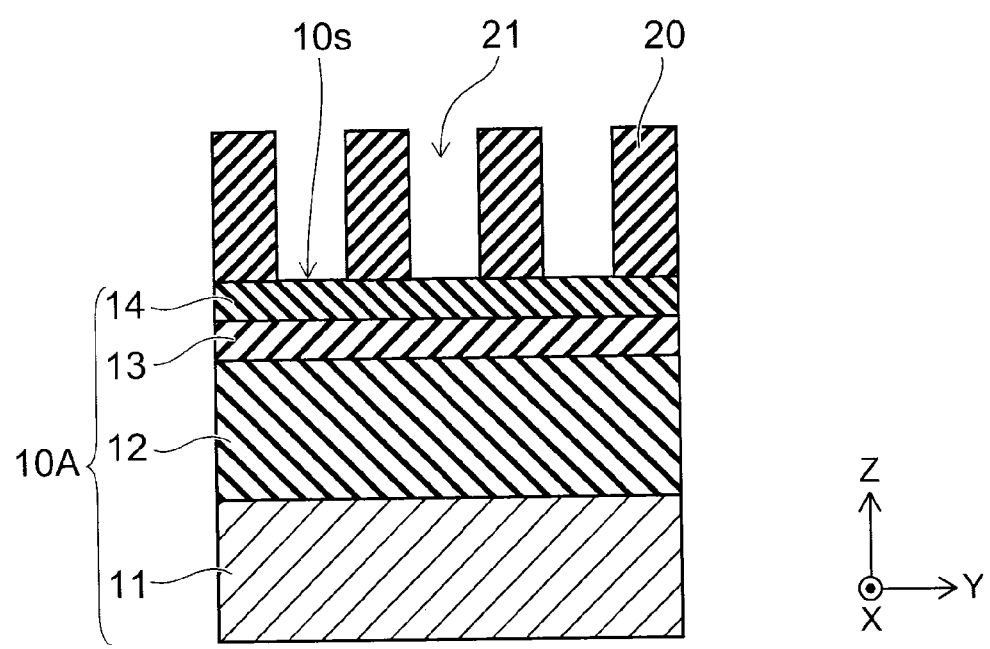

First, as shown in FIG. 2A and FIG. 2B, a guide layer 20 (a first guide layer) is formed on an underlayer 10A by photolithography and dry etching (step S10 (FIG. 1)).

The guide layer 20 has a plurality of openings 21 that expose the surface 10s of the underlayer 10A. The plurality of openings 21 are arranged in the Y-direction (a first direction). In the X-Y plane, the opening 21 is in an oval shape, for example. In each of the plurality of openings 21, the width d1 in the Y-direction is shorter than the width d2 in the X-direction (a second direction) crossing the Y-direction.

The plurality of openings 21 have a first group 1G aligned in the Y-direction and a second group 2G aligned in the Y-direction. In the Y-direction, the phase of the period of the positions of the plurality of openings 21 of the first group 1G and the phase of the period of the positions of the plurality of openings 21 of the second group 2G are shifted from each other. The first group 1G and the second group 2G are alternately arranged in the X-direction.

The number of openings 21 is not limited to the number illustrated. Openings 21 may be arranged in the X-direction and the Y-direction in a larger number than the number illustrated. In the Y-direction, the pitch of the plurality of openings 21 of the first group 1G and the pitch of the plurality of openings 21 of the second group 2G do not necessarily need to be made to agree, and the pitches may be different.

The underlayer 10A includes a substrate 11, a first hard mask layer 12 provided on the substrate 11, a second hard mask layer 13 provided on the first hard mask layer 12, and a reflection prevention film 14 provided on the second hard mask layer 13.

The guide layer 20 includes a positive resist layer or a negative resist layer, for example. The thickness of the guide layer 20 is 120 nm (nanometers), for example. ArF light (e.g. ArF excimer laser light) is used when the guide layer 20 is patterned. Immersion exposure technology is used when the guide layer 20 is patterned. An alkali solution of TMAH (tetramethylammonium hydroxide) or the like is used in development after exposure. Annealing treatment (e.g. 250° C., 120 seconds) is performed on the guide layer 20 in order to cure it, as necessary.

The substrate 11 is a semiconductor substrate of silicon or the like, for example. The substrate 11 may be an insulating layer such as an interlayer insulating film or a conductive layer. The first hard mask layer 12 includes a carbon film, for example. The thickness of the first hard mask layer 12 is 250 nm, for example. The second hard mask layer 13 includes a silicon oxide film, for example. The thickness of the second hard mask layer 13 is 50 nm, for example. The first hard mask layer 12 and the second hard mask layer 13 are formed by CVD (chemical vapor deposition), for example.

The reflection prevention film 14 includes one of a silicon oxide film, a carbon film, a stacked film of silicon oxide film/carbon film, an organic film, and a metal film. The thickness of the reflection prevention film 14 is 35 nm, for example. The reflection prevention film 14 is formed by the application method or CVD, for example. The reflection prevention film 14 may be removed as necessary.

The stacked structure of the underlayer 10A described above is only an example, and other stacked structures are possible.

Figure 3A:
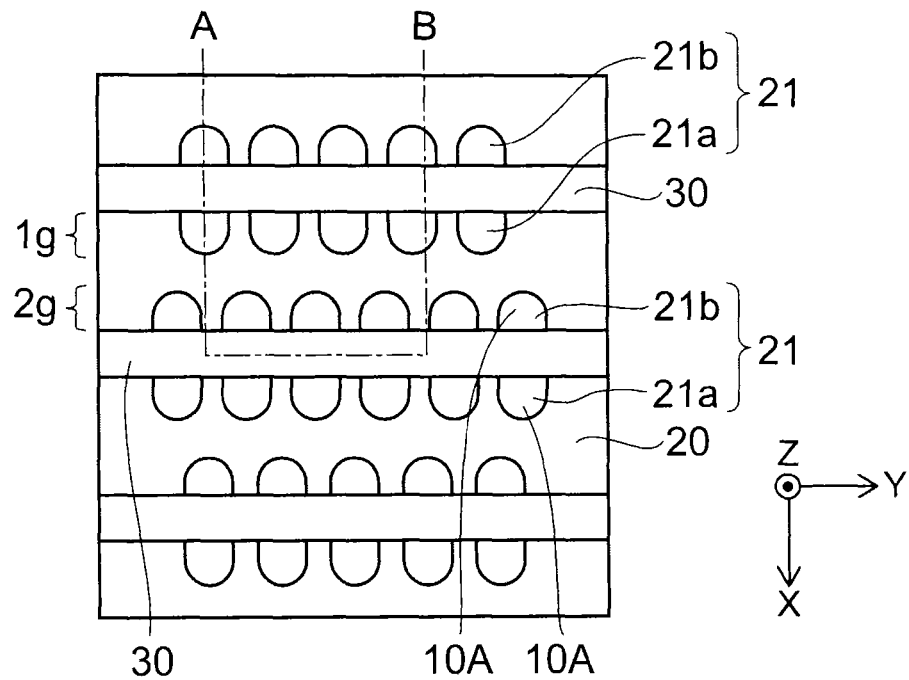
Figure 3B:
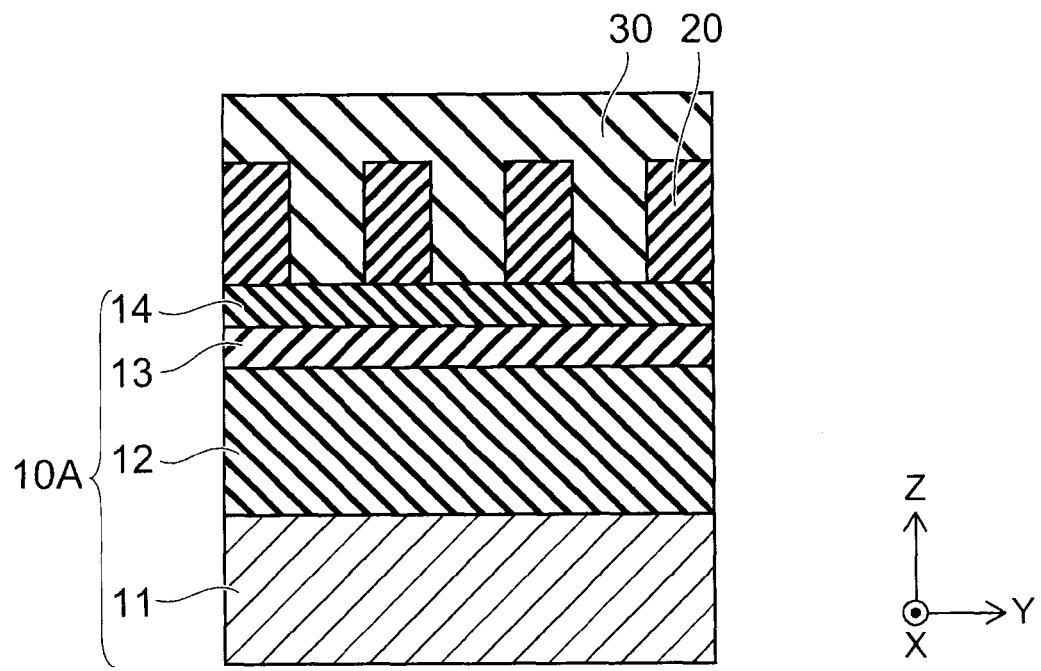

Next, as shown in FIG. 3A and FIG. 3B, a guide layer 30 (a second guide layer) is formed on the underlayer 10A and on the guide layer 20 (step S20 (FIG. 1)). The guide layer 30 is formed by photolithography and dry etching. The photolithography and dry etching in this stage correspond to the second photolithography and dry etching in the flow shown in FIG. 2A to FIG. 7B.

The guide layer 30 includes a positive resist layer, for example. The material of the guide layer 30 is the same as the material of the guide layer 20, for example. The first embodiment illustrates the case where both the guide layers 20 and 30 are a positive resist layer, as an example.

The guide layer 30 extends in the Y-direction. Each of the plurality of openings 21 is divided into an opening portion 21a (a first opening portion) and an opening portion 21b (a second opening portion) by the guide layer 30. The guide layer 30 is sandwiched by the opening portion 21a and the opening portion 21b.

In this stage, the opening portion 21a and the opening portion 21b, which are smaller than the opening 21, are formed. Each of the opening portion 21a and the opening portion 21b is surrounded by the guide layer 20 and the guide layer 30 in the X-Y plane (FIG. 3A). The underlayer 10A is exposed from each of the opening portion 21a and the opening portion 21b. The plurality of opening portions have a first group 1g aligned in the Y-direction and a second group 2g of which the phase of the positions is shifted from that of the first group 1g. For example, in the Y-direction, the phase of the period of the positions of the plurality of opening portions 21a of the first group 1g and the phase of the period of the positions of the plurality of opening portions 21b of the second group 2g are shifted from each other.

Figure 4A:
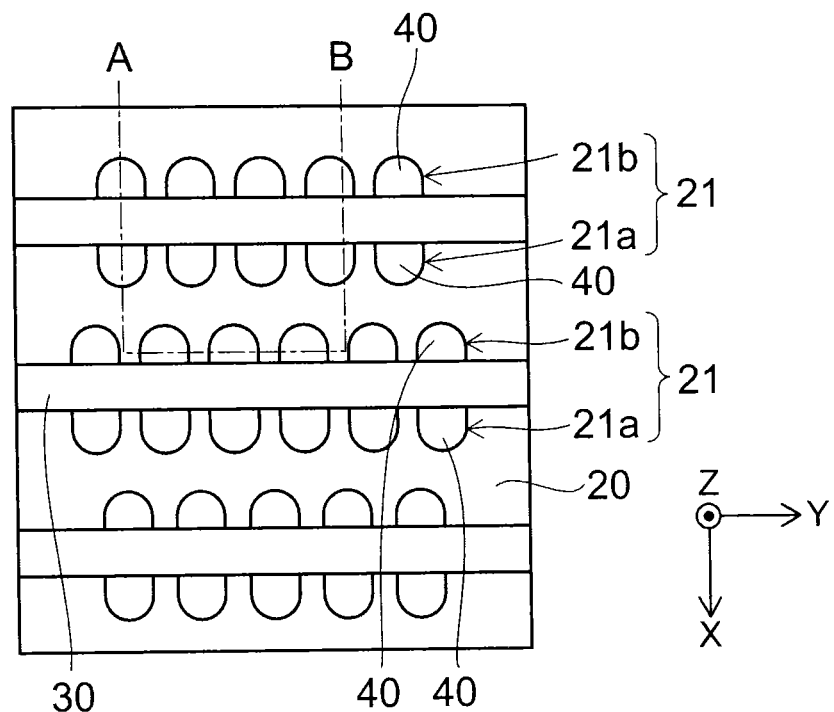
Figure 4B:
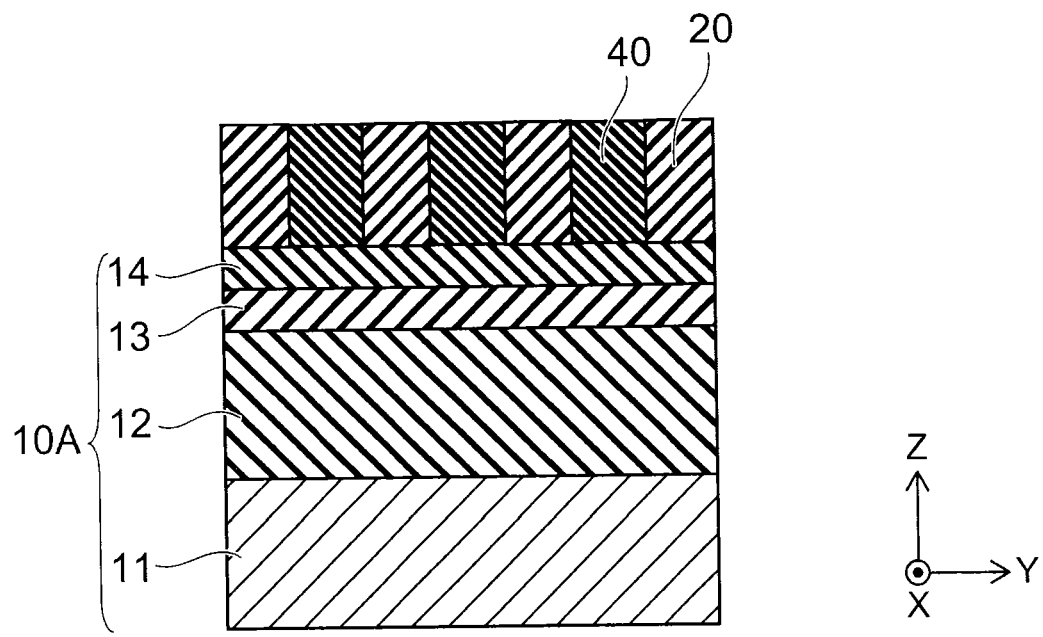

Next, as shown in FIG. 4A and FIG. 4B, a block copolymer layer 40 is formed in each of the opening portion 21a and the opening portion 21b (step S30 (FIG. 1)).

The block copolymer layer 40 contains a polystyrene derivative, poly(methyl methacrylate) (an acrylic), and an organic solvent that can dissolve these polymer materials, for example. The block copolymer layer 40 is formed in the opening portion 21a and the opening portion 21b by the spin coating method, for example. The height of the block copolymer layer 40 is adjusted to the same height as the height of the guide layer 20.

Figure 5A:
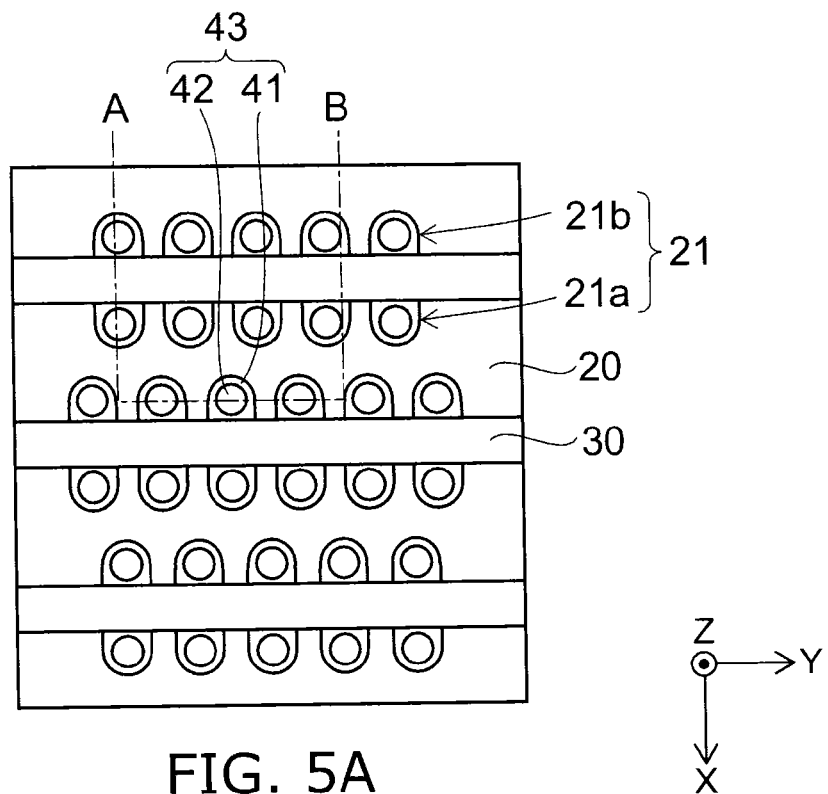
Figure 5B:
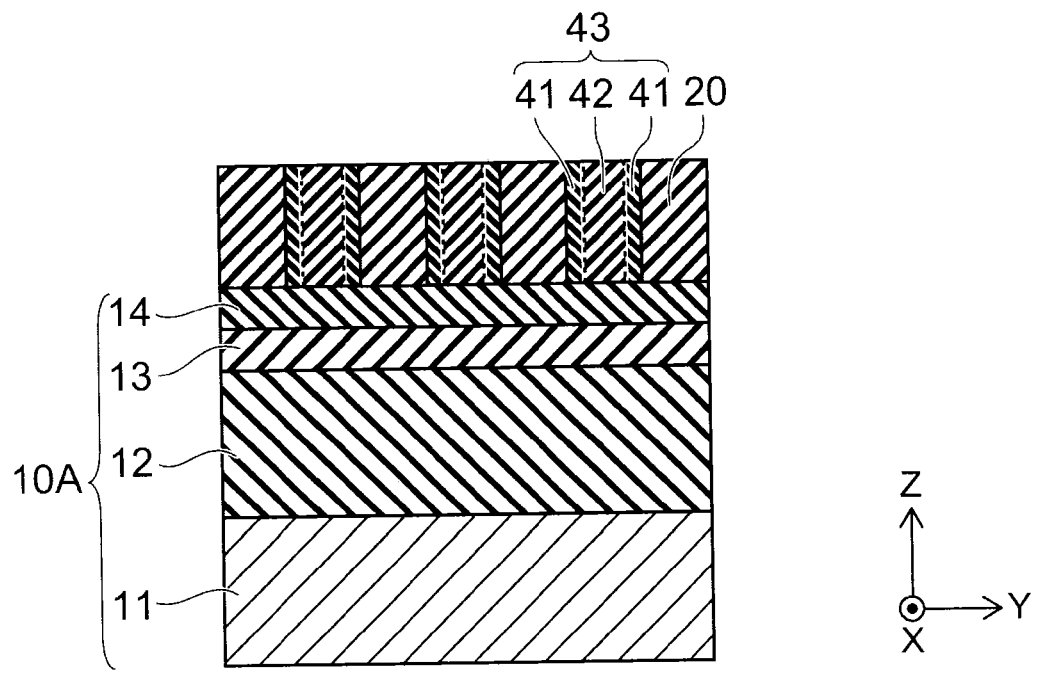

Next, as shown in FIG. 5A and FIG. 5B, the block copolymer layer 40 is heated to be microphase-separated. The heating treatment is 250° C. and 60 seconds, for example. Thereby, a first layer 41 and a second layer 42 surrounded by the first layer 41 are formed in each of the opening portion 21a and the opening portion 21b (step S40 (FIG. 1)). That is, a self-assembled layer 43 including the first layer 41 and the second layer 42 is formed in each of the opening portion 21a and the opening portion 21b. The organic solvent contained in the block copolymer layer 40 is vaporized by the heating.

Here, the first layer 41 is a layer containing a polystyrene derivative, and the second layer 42 is a layer containing poly (methyl methacrylate).

The self-assembled layer 43 is a layer formed by microphase-separating a block copolymer by heating. It is assumed that the block copolymer includes two kinds of polymers A and B, for example. In the case where the affinity of the polymer A to the guide layers 20 and 30 is higher than the affinity of the polymer B to the guide layers 20 and 30, the polymer A is more likely to gather at the side walls of the guide layers 20 and 30 than the polymer B after microphase separation. Subsequently, the polymer B gathers at the side wall of the polymer A. Thereby, in the X-Y plane, A and B are self-arranged, and polymers are arranged regularly in the order of AB from the side walls of the guide layers 20 and 30. In other words, the first layer 41 of a cylinder structure and the second layer 42 surrounded by the first layer 41 are formed.

In the case where the block copolymer includes polystyrene (PS)-poly(methyl methacrylate) (PMMA), the affinity of the polystyrene derivative to the guide layers 20 and 30 is higher than the affinity of the poly(methyl methacrylate) to the guide layers 20 and 30, for example. Thus, for the polymers A and B mentioned above, the polymer A corresponds to polystyrene (PS), and the polymer B corresponds to poly (methyl methacrylate) (PMMA).

Figure 6A:
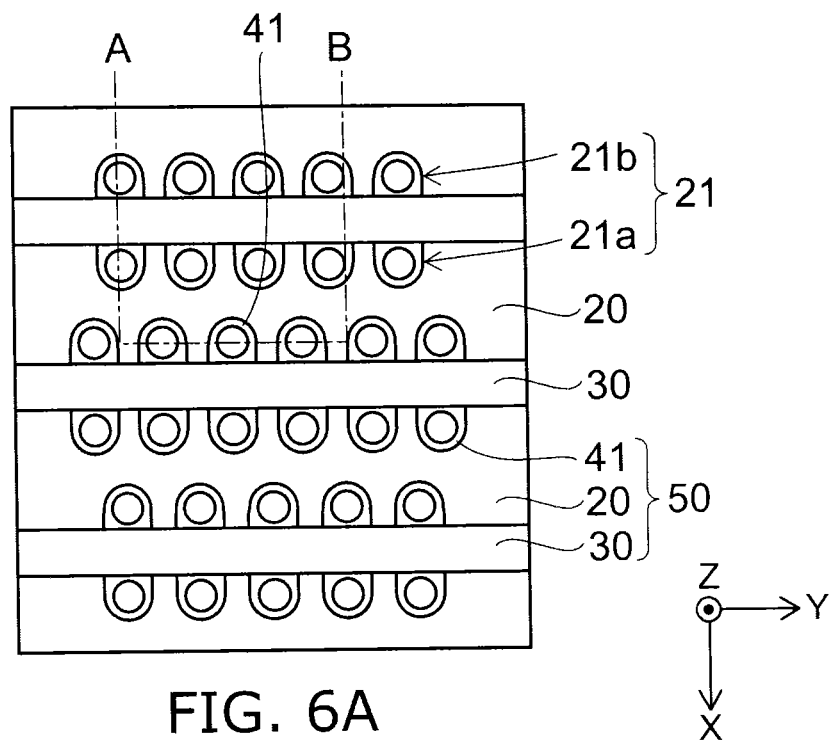
Figure 6B:
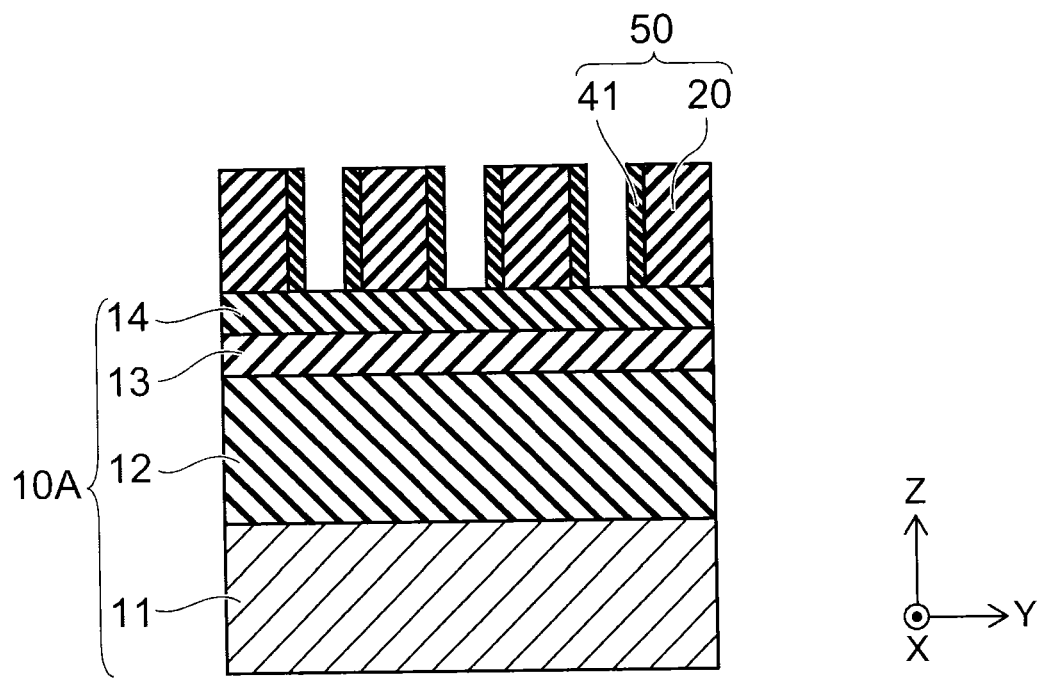

Next, as shown in FIG. 6A and FIG. 6B, the second layer 42 is removed (step S50 (FIG. 1)). For example, the second layer 42 having lower dry etching resistance than the first layer 41 is removed by dry etching. After the dry etching, the first layer 41 in contact with the guide layers 20 and 30 is left.

Figure 7A:
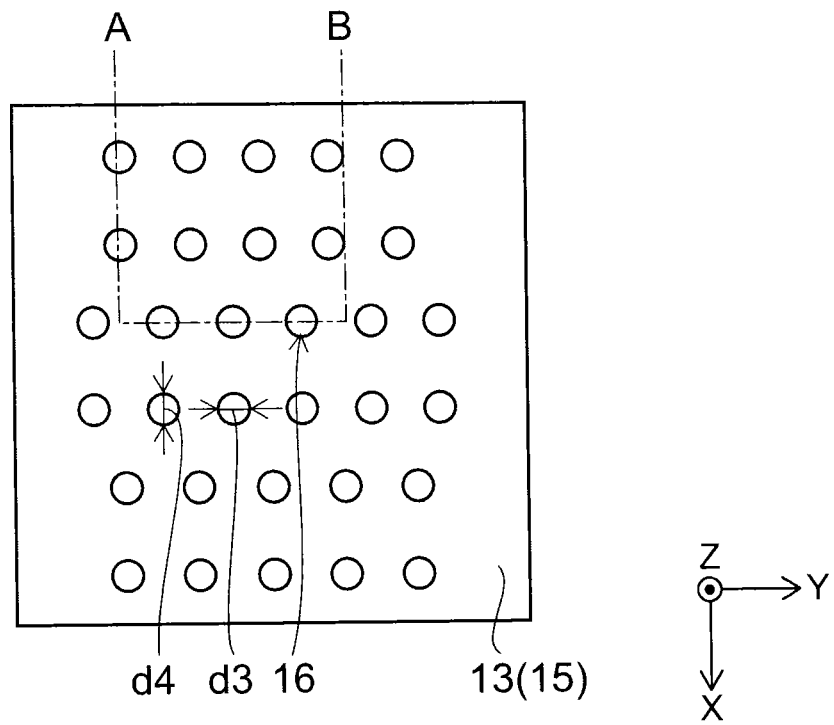
Figure 7B:
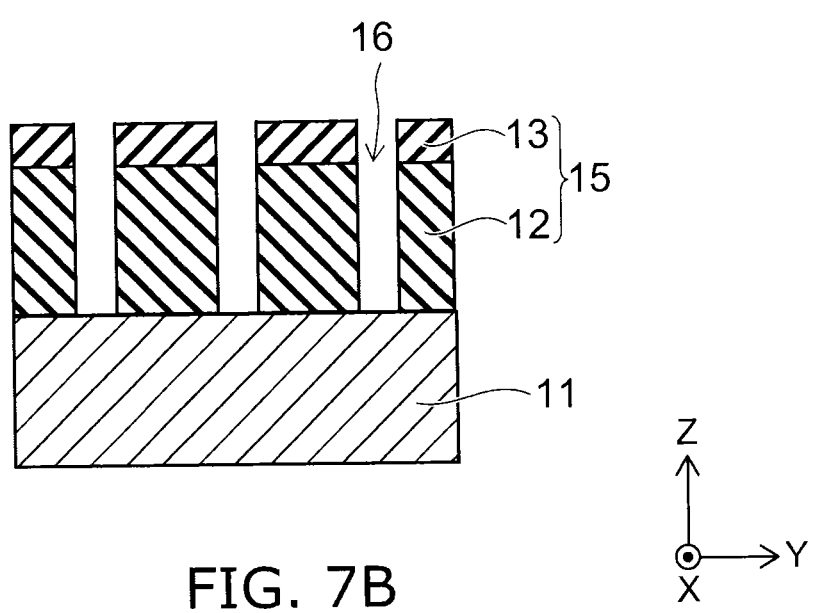

Subsequently, the guide layers 20 and 30 and the first layer 41 are used as a mask layer 50 to perform dry etching processing on the reflection prevention film 14 exposed from the mask layer 50, the second hard mask layer 13 directly under this reflection prevention film 14, and the first hard mask layer 12 directly under this second hard mask layer 13. In other words, the pattern of the mask layer 50 is transferred to the reflection prevention film 14, the second hard mask layer 13, and the first hard mask layer 12. FIG. 7A and FIG. 7B show this state.

As shown in FIG. 7A and FIG. 7B, the first hard mask layer 12 and the second hard mask layer 13 in which the pattern of the mask layer 50 is transferred are formed on the substrate 11. A hard mask layer 15 including the first hard mask layer 12 and the second hard mask layer 13 has a plurality of openings 16. The plurality of openings 16 are arranged in a zigzag configuration in the X-Y plane.

Here, the openings arranged in a zigzag configuration refer to openings in a state where, when a group of two columns of openings aligned in the X-direction, for example, are arbitrarily selected in the X-Y plane, the phases of the periods of the positions of the openings in this group of two columns are shifted from each other. In the case where the phases of the periods of the positions of the openings in the group of two columns agree with each other in the X-direction, the openings are referred to as openings arranged in a lattice configuration (or a grid configuration).

The width $d3$ in the Y-direction of each of the plurality of openings 16 is narrower than the width $d1$ in the Y-direction of the opening 21. The width $d4$ in the X-direction of each of the plurality of openings 16 is narrower than the width $d2$ in the X-direction of the opening 21. This is because the first hard mask layer 12 and the second hard mask layer 13 have been processed by dry etching while the first layer 41 out of the first layer 41 and the second layer 42 formed by microphase separation is left. That is, by the first embodiment, a finer opening pattern can be formed.

After that, the hard mask layer 15 having the plurality of openings 16 may be used to perform the dry etching processing of the substrate 11. In other words, the pattern of the hard mask layer 15 can be transferred to the substrate 11.

Also an example in which the guide layers 20 and 30 are formed using a negative resist layer is included in the embodiment. Even when such a selection is made, the effects of the embodiment are not changed. In the case where the guide layers 20 and 30 are formed using a negative resist layer, a butyl acetate solution is used as the developer.

A process in which a mask layer having openings arranged in a zigzag configuration is formed without using the block copolymer layer 40 will now be described.

FIG. 8A to FIG. 8F are schematic plan views showing a pattern formation method according to a reference example.

FIG. 8A to FIG. 8F show a reference example in which an opening pattern of a zigzag configuration is formed.

First, as shown in FIG. 8A, a plurality of mask layers 100 are formed on the underlayer 10A by the first photolithography and dry etching. The plurality of mask layers 100 extend in the X-direction, and are arranged in the Y-direction.

Next, as shown in FIG. 8B, a plurality of mask layers 101 are formed on the underlayer 10A by the second photolithography and dry etching. The plurality of mask layers 100 extend in the Y-direction, and are arranged in the X-direction. In other words, the mask layer 101 is made to cross the mask layer 100.

Next, as shown in FIG. 8C, dry etching processing is performed on the underlayer 10A exposed from the mask layers 100 and 101. After that, the mask layers 100 and 101 are removed. Thereby, a hard mask layer 15 in which openings 16 are arranged in the X-direction and the Y-direction is formed. At this stage, the openings 16 are arranged in a lattice configuration.

Next, as shown in FIG. 8D, a plurality of mask layers 102 are formed on the hard mask layer 15 by the third photolithography and dry etching. The plurality of mask layers 102 extend in the X-direction, and are arranged in the Y-direction. Each of the plurality of mask layers 102 seals the opening 16.

Next, as shown in FIG. 8E, a plurality of mask layers 103 are formed on the hard mask layer 15 by the fourth photolithography and dry etching. The plurality of mask layers 103 extend in the Y-direction, and are arranged in the X-direction. Each of the plurality of mask layers 103 seals the opening 16. The mask layer 103 is made to cross the mask layer 102. In other words, portions of the surface of the hard mask layer 15 where the opening 16 is not formed are exposed by the mask layers 102 and 103.

Next, as shown in FIG. 8F, dry etching processing is performed on the hard mask layer 15 exposed from the mask layers 102 and 103. After that, the mask layers 102 and 103 are removed. Thereby, a hard mask layer 15 in which new openings 16 are arranged in the X-direction and the Y-direction is formed.

Here, it can be seen that FIG. 8F shows a state where the opening pattern shown in FIG. 8C and the opening pattern formed by the dry etching processing of FIG. 8F are added up. Also in the pattern formation method according to the reference example, an opening pattern arranged in a zigzag configuration is formed.

However, in the pattern formation method according to the reference example, the number of photolithography processes and the number of dry etching processes when mask layers are formed are each as large as four (FIG. 8A, FIG. 8B, FIG. 8D, and FIG. 8E). Therefore, in the reference example, the number of manufacturing processes is increased as compared the first embodiment, and manufacturing costs are increased.

In contrast, in the first embodiment, the number of photolithography processes and the number of dry etching processes when mask layers are formed are each only two, which are the photolithography and dry etching when the guide layer 20 is formed and the photolithography and dry etching when the guide layer 30 is formed (FIGS. 2A and 2B and FIGS. 3A and 3B). Therefore, the number of manufacturing processes is reduced as compared to the reference example, and manufacturing costs can be reduced.

Furthermore, in the first embodiment, openings are formed using the technology of microphase-separating a block copolymer. Therefore, minute openings can be formed in a mask layer.

Furthermore, in the first embodiment, in the stage of forming the guide layer 20, an opening pattern can be prepared in which the pitch of the plurality of openings 21 of the first group 1G in the Y-direction and the pitch of the plurality of openings 21 of the second group 2G in the Y-direction are different. By preparing such an opening pattern beforehand, the pitch of the plurality of opening portions 21a of the first group 1g in the Y-direction and the pitch of the plurality of opening portions 21b of the second group 2g in the Y-direction can be differentiated, even for opening portions 21a and 21b that are processed more finely.

Second Embodiment

The guide layer does not need to be a resist-containing layer, and may be a silicon-containing layer.

FIG. 9A to FIG. 11B are schematic plan views or schematic cross-sectional views showing a pattern formation method according to a second embodiment.

Of FIG. 9A to FIG. 11B, the drawings of the numbers including "A" are schematic plan views, and the drawings of the numbers including "B" are schematic cross-sectional views. The drawings of the numbers including "B" show a cross section taken along line A-B of the drawings of the numbers including "A".

Figure 9A:
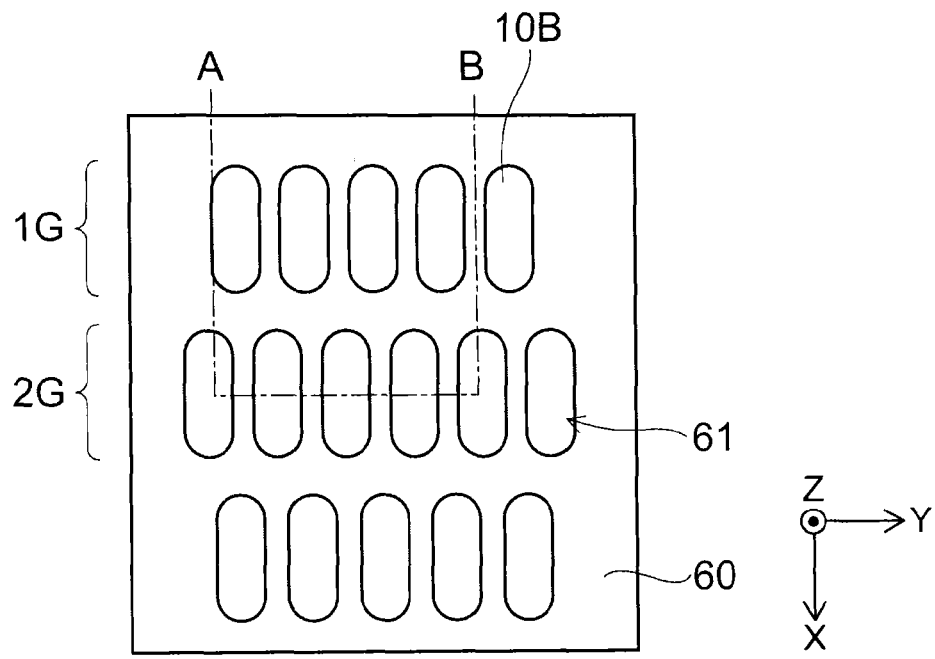
FIG. 9A to FIG. 11B are schematic plan views or schematic cross-sectional views showing a pattern formation method according to a second embodiment.
Figure 9B:
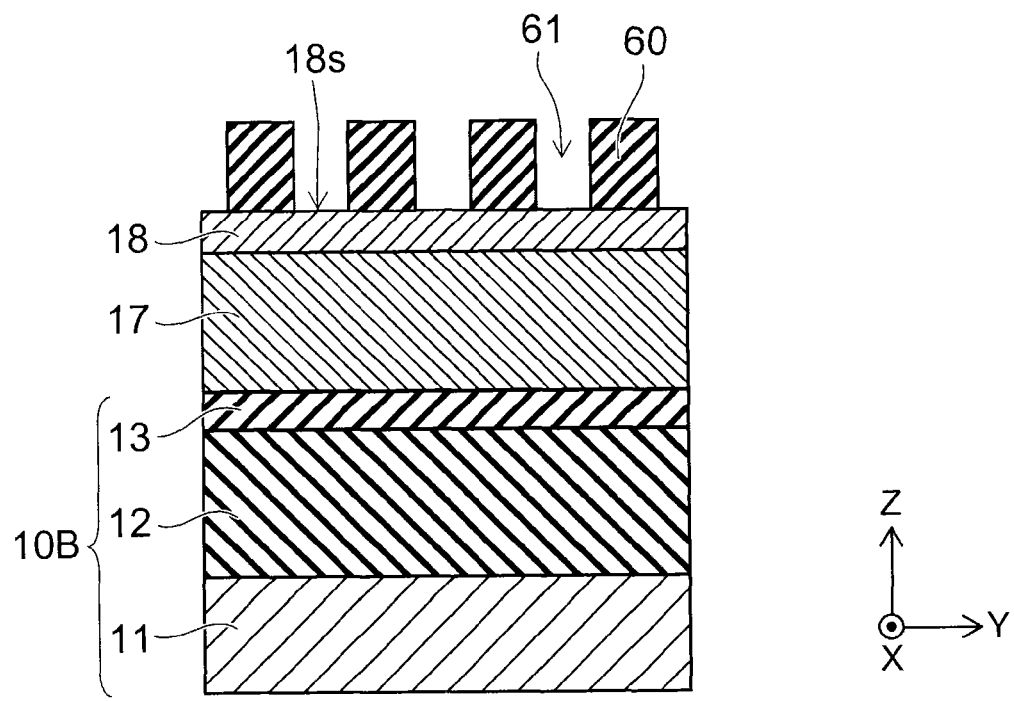

First, as shown in FIG. 9A and FIG. 9B, a carbon-containing layer 17 is formed on an underlayer 10B, and a silicon-containing layer 18 is formed on the carbon-containing layer 17. The carbon-containing layer 17 is an SOC (spin on carbon) layer, for example. The silicon-containing layer 18 is an SOG (spin on glass) layer, for example. Subsequently, a mask layer 60 is formed on the silicon-containing layer 18 by photolithography and dry etching.

The thickness of the carbon-containing layer 17 is 120 nm, for example. The thickness of the silicon-containing layer 18 is 30 nm. The optical constants and the film thicknesses of the carbon-containing layer 17 and the silicon-containing layer 18 are adjusted so that the stacked film of these layers forms a reflection prevention film to ArF light.

The mask layer 60 has a plurality of openings 61 that expose the surface 18s of the silicon-containing layer 18. The mask layer 60 includes a positive resist layer. The thickness of the mask layer 60 is 80 nm. The plurality of openings 61 are arranged in the Y-direction. In the X-Y plane, the shape of the opening 61 is the same as that of the opening 21.

The plurality of openings 61 have a first group 1G aligned in the Y-direction and a second group 2G aligned in the Y-direction. In the Y-direction, the phase of the period of the positions of the plurality of openings 61 of the first group 1G and the phase of the period of the positions of the plurality of openings 61 of the second group 2G are shifted from each other. The first group 1G and the second group 2G are alternately arranged in the X-direction.

The number of openings 61 is not limited to the number illustrated. In the Y-direction, the pitch of the plurality of openings 61 of the first group 1G and the pitch of the plurality of openings 61 of the second group 2G do not necessarily need to be made to agree, and the pitches may be different.

The underlayer 10B includes the substrate 11, the first hard mask layer 12 provided on the substrate 11, and the second hard mask layer 13 provided on the first hard mask layer 12. The thickness of the first hard mask layer 12 is 400 nm, for example. The thickness of the second hard mask layer 13 is 100 nm, for example.

The optical constants and the film thicknesses of the first hard mask layer 12 and the second hard mask layer 13 are adjusted so that the stacked film of these layers forms a reflection prevention film to ArF light.

Figure 10A:
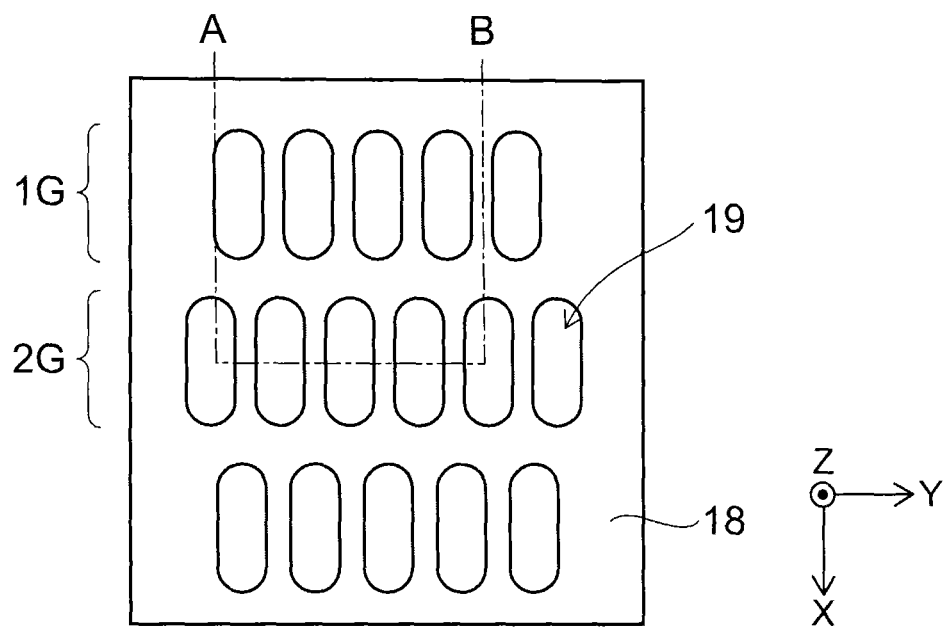
Figure 10B:
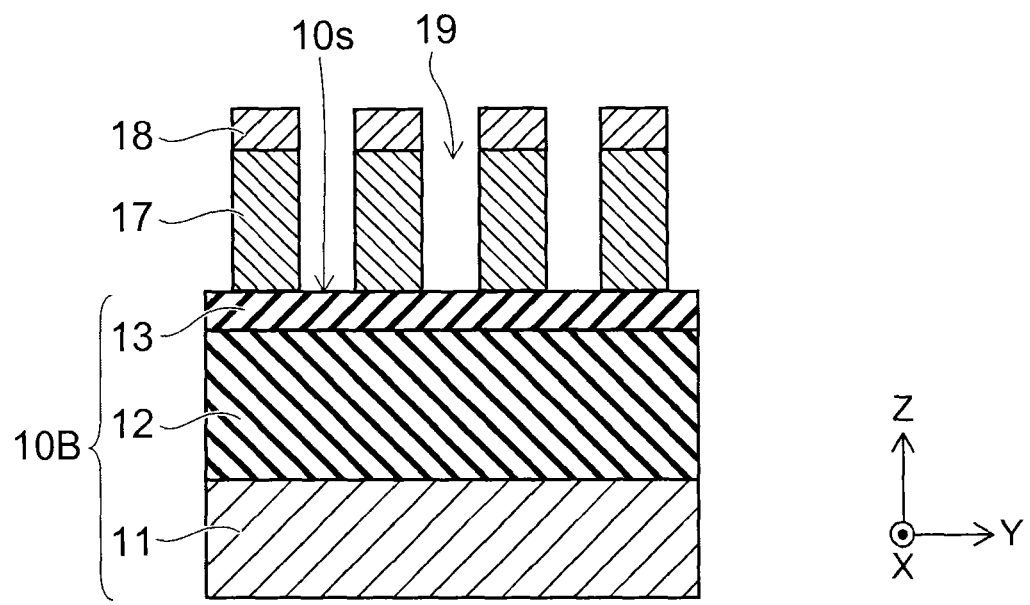

Subsequently, dry etching processing is performed on the silicon-containing layer 18 exposed from the mask layer 60 and the carbon-containing layer 17 directly under this silicon-containing layer 18. After that, the mask layer 60 is removed. FIG. 10A and FIG. 10B show this state.

As shown in FIG. 10A and FIG. 10B, the carbon-containing layer 17 has a plurality of openings 19 that expose the surface 10s of the underlayer 10B. The plurality of openings 19 are arranged in the Y-direction. In the X-Y plane, the shape of the opening 19 is the same as that of the opening 61.

The plurality of openings 19 have a first group 1G aligned in the Y-direction and a second group 2G aligned in the Y-direction. In the Y-direction, the phase of the period of the positions of the plurality of openings 19 of the first group 1G and the phase of the period of the positions of the plurality of openings 19 of the second group 2G are shifted from each other. The first group 1G and the second group 2G are alternately arranged in the X-direction. After that, the silicon-containing layer 18 is removed.

Figure 11A:
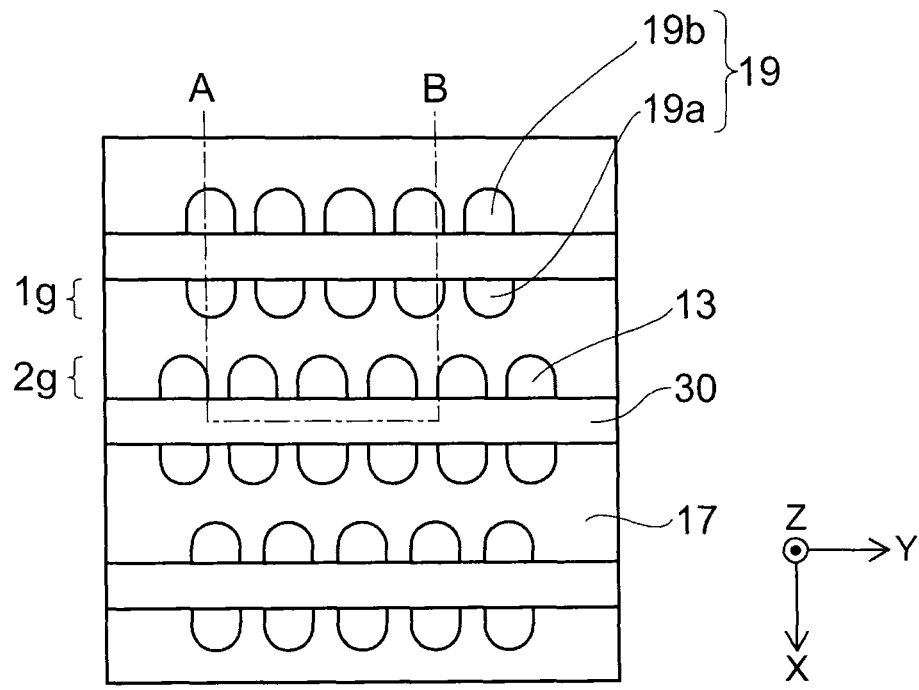
Figure 11B:
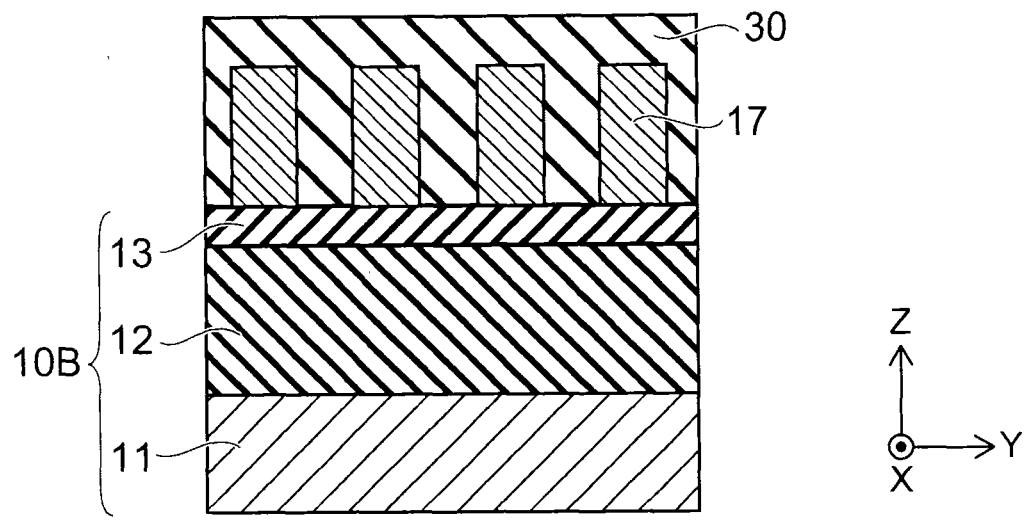

Next, as shown in FIG. 11A and FIG. 11B, the guide layer is formed on the underlayer 10B and on the carbon-containing layer 17. The guide layer 30 is formed by photolithography and dry etching. The guide layer 30 includes a positive resist layer, for example.

The guide layer 30 extends in the Y-direction. Each of the plurality of openings 19 is divided into an opening portion 19a and an opening portion 19b by the guide layer 30. The guide layer 30 is sandwiched by the opening portion 19a and the opening portion 19b.

In this stage, the opening portion 19a and the opening portion 19b, which are a smaller opening than the opening 19, are formed. In the second embodiment, the carbon-containing layer 17 functions as a guide layer. In other words, each of the opening portion 19a and the opening portion 19b is surrounded by the carbon-containing layer 17, which is a guide layer, and the guide layer 30 in the X-Y plane (FIG. 11A). The underlayer 10B is exposed from each of the opening portion 19a and the opening portion 19b. The plurality of opening portions have a first group 1g aligned in the Y-direction and a second group 2g of which the phase of the positions is shifted from that of the first group 1g. For example, in the Y-direction, the phase of the period of the positions of the plurality of opening portions 19a of the first group 1g and the phase of the period of the positions of the plurality of opening portions 19b of the second group 2g are shifted from each other.

After that, similarly to the first embodiment, the block copolymer layer 40 is formed in each of the opening portions 19a and 19b. Then, the block copolymer layer 40 is microphase-separated. After that, similarly to the first embodiment, the pattern of the opening portions 19a and 19b is transferred to the first hard mask layer 12 and the second hard mask layer 13. Also in the second embodiment, similar effects to the first embodiment are obtained.

Third Embodiment

When openings 21 are formed in the guide layer 20, a reticle having a pattern corresponding to the pattern of the openings 21 may be used to transfer the pattern of the openings 21 to the guide layer 20 by one shot. Further, the openings 21 may be formed in the guide layer 20 by the following process.

Figure 12A:
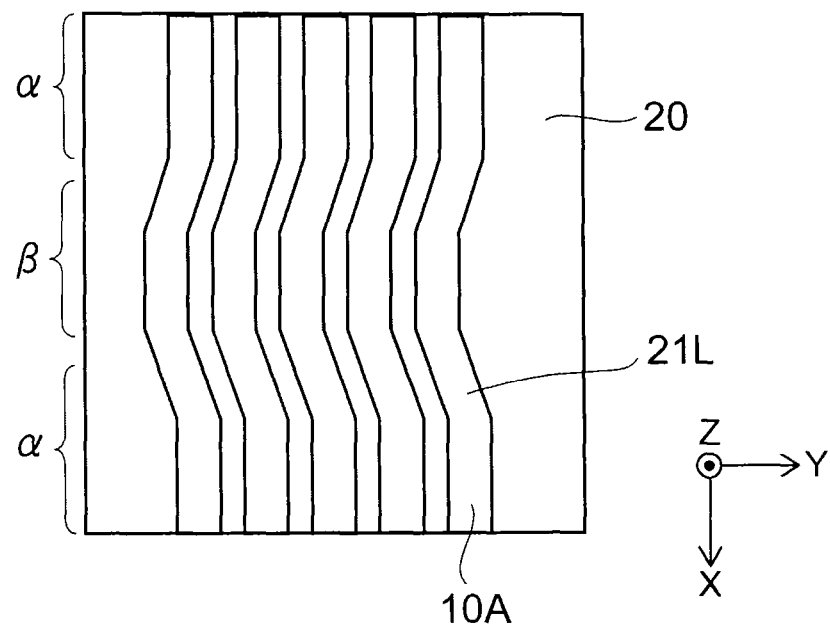
FIG. 12A and FIG. 12B are schematic plan views showing a pattern formation method according to a third embodiment.
Figure 12B:
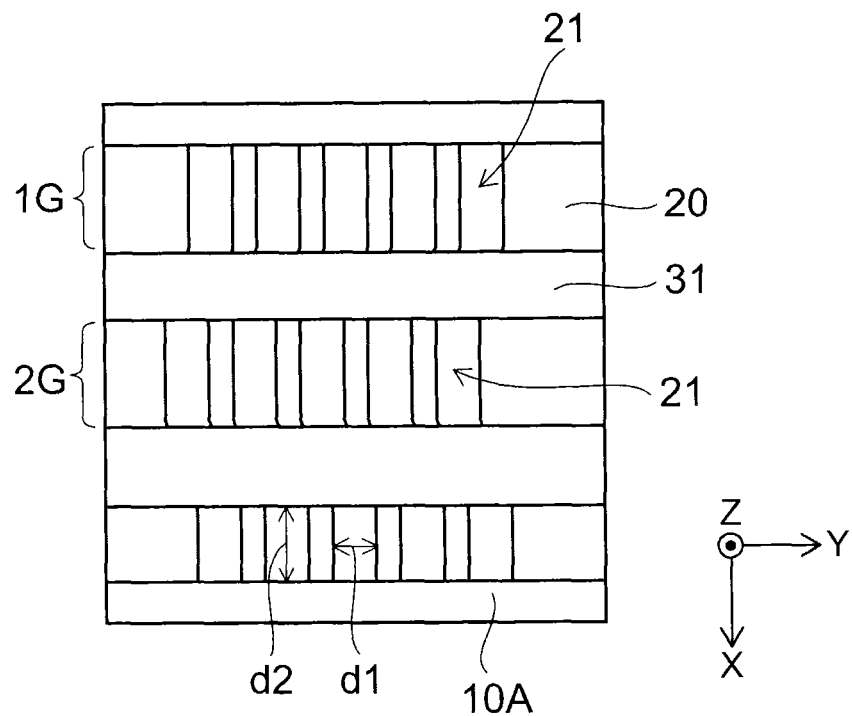

FIG. 12A and FIG. 12B are schematic plan views showing a pattern formation method according to a third embodiment.

As shown in FIG. 12A, a plurality of openings 21L are formed in the guide layer 20 by photolithography and dry etching. Each of the plurality of openings 21L is a trench-like opening. The plurality of openings 21L extend in the X-direction, and are aligned in the Y-direction.

However, the opening 21L extending in the X-direction does not extend rectilinearly in the X-direction, and is in a wave form in the X-Y plane. For example, the opening 21L forms a wave in which an a portion of the opening 21L and a β portion of the opening 21L that is shifted in the −Y-direction from the a portion constitute one wavelength.

Next, as shown in FIG. 12B, a guide layer 31 extending in the Y-direction is formed on the underlayer 10A and on the guide layer 20. The α portion of the opening 21L and the β portion of the opening 21L are separated by the guide layer 31.

That is, by separating the a portion of the opening 21L and the β portion of the opening 21L, the guide layer 20 has a plurality of openings 21 that expose the underlayer 10A. The plurality of openings 21 are arranged in the Y-direction. In each of the plurality of openings 21, the width d1 in the Y-direction is shorter than the width d2 in the X-direction.

The plurality of openings 21 have a first group 1G aligned in the Y-direction and a second group 2G aligned in the Y-direction. In the Y-direction, the phase of the period of the positions of the plurality of openings 21 of the first group 1G and the phase of the period of the positions of the plurality of openings 21 of the second group 2G are shifted from each other. The first group 1G and the second group 2G are alternately arranged in the X-direction. Also by such a process, a plurality of openings 21 can be formed in the guide layer 20.

The term "on" in "a portion A is provided on a portion B" refers to the case where the portion A is provided on the portion B such that the portion A is in contact with the portion B and the case where the portion A is provided above the portion B such that the portion A is not in contact with the portion B. The term "on" in "a portion A is provided on a portion B" refers to the case where the portion A is provided under the portion B such that the portion A and the portion B are turned upside down and the portion A comes abreast of the portion B. This is because that, if the semiconductor device according to embodiments are rotated, the structure of the semiconductor device remains unchanged before and after rotation.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method comprising:
    forming a first guide layer on an underlayer, the first guide layer having a plurality of first openings exposing a surface of the underlayer, and the plurality of first openings being arranged in a first direction;
    forming a second guide layer on the underlayer and on the first guide layer, the second guide layer extending in the first direction, the second guide layer being sandwiched by a first opening portion and a second opening portion, and the second guide layer dividing each of the plurality of first openings into the first opening portion and the second opening portion;
    forming a block copolymer layer in each of the first opening portion and the second opening portion;
    forming a first layer and a second layer surrounded by the first layer in each of the first opening portion and the second opening portion by phase-separating the block copolymer layer; and
    removing the second layer.

2. The pattern formation method according to claim 1, wherein a width of each of the plurality of first openings in the first direction is shorter than a width in a second direction crossing the first direction.

3. The pattern formation method according to claim 1, wherein each of the plurality of first openings is divided into the first opening portion and the second opening portion in a second direction crossing the first direction.

4. The pattern formation method according to claim 1, wherein a height of the block copolymer layer is adjusted to the same height as a height of the first guide layer.

5. The pattern formation method according to claim 1, wherein
    the plurality of first openings have a first group aligned in the first direction and a second group aligned in the first direction,
    a phase of a period of positions of the plurality of first openings of the first group and a phase of a period of positions of the plurality of first openings of the second group are shifted from each other, and
    the first group and the second group are alternately arranged in a second direction crossing the first direction.

6. The pattern formation method according to claim 5, wherein the first group and the second group are formed by
    forming a plurality of second openings in the first guide layer, the plurality of second openings being aligned in the first direction and extending in the second direction, each of the plurality of second openings having a first region and a second region shifted in the first direction from the first region, and
    forming a third guide layer extending in the first direction on the underlayer and on the first guide layer to separate the first region and the second region of the plurality of second openings.

7. The pattern formation method according to claim 5, wherein a pitch of the plurality of first openings of the first group and a pitch of the plurality of first openings of the second group are different in the first direction.

8. The pattern formation method according to claim 2, wherein
    the plurality of first openings have a first group aligned in the first direction and a second group aligned in the first direction,
    a phase of a period of positions of the plurality of first openings of the first group and a phase of a period of positions of the plurality of first openings of the second group are shifted from each other, and
    the first group and the second group are alternately arranged in the second direction crossing the first direction.

9. The pattern formation method according to claim 8, wherein the first group and the second group are formed by
    forming a plurality of second openings in the first guide layer, the plurality of second openings being aligned in the first direction and extending in the second direction, each of the plurality of second openings having a first region and a second region shifted in the first direction from the first region, and
    forming a third guide layer extending in the first direction on the underlayer and on the first guide layer to separate the first region and the second region of the plurality of second openings.

10. The pattern formation method according to claim 8, wherein a pitch of the plurality of first openings of the first group and a pitch of the plurality of first openings of the second group are different in the first direction.

11. The pattern formation method according to claim 1, wherein one of a resist-containing layer and a carbon-containing layer is used as the first guide layer.

12. The pattern formation method according to claim 2, wherein one of a resist-containing layer and a carbon-containing layer is used as the first guide layer.

13. The pattern formation method according to claim 5, wherein one of a resist-containing layer and a carbon-containing layer is used as the first guide layer.

14. The pattern formation method according to claim 1, wherein a resist-containing layer is used as the second guide layer.

15. The pattern formation method according to claim 2, wherein a resist-containing layer is used as the second guide layer.

* * * * *